(12) United States Patent
Sun et al.

(10) Patent No.: US 12,281,378 B2
(45) Date of Patent: Apr. 22, 2025

(54) MASK

(71) Applicant: KunShan Go-Visionox Opto-Electronics Co., Ltd., Jiangsu (CN)

(72) Inventors: Lin Sun, Jiangsu (CN); Jingjing Zhao, Jiangsu (CN); Mingxing Liu, Jiangsu (CN)

(73) Assignee: KunShan Go-Visionox Opto-Electronics Co., Ltd., Kunshan (CN)

( * ) Notice: Subject to any disclaimer, the term of this patent is extended or adjusted under 35 U.S.C. 154(b) by 445 days.

(21) Appl. No.: 17/465,146

(22) Filed: Sep. 2, 2021

(65) Prior Publication Data

US 2021/0395874 A1 Dec. 23, 2021

Related U.S. Application Data

(63) Continuation of application No. PCT/CN2020/086112, filed on Apr. 22, 2020.

(30) Foreign Application Priority Data

Aug. 30, 2019 (CN) .......................... 201910813249.7

(51) Int. Cl.
*C23C 14/04* (2006.01)
*C23C 14/24* (2006.01)

(52) U.S. Cl.
CPC ............ *C23C 14/042* (2013.01); *C23C 14/24* (2013.01)

(58) Field of Classification Search
None
See application file for complete search history.

(56) References Cited

U.S. PATENT DOCUMENTS

| 7,704,326 B2 | 4/2010 | Hagiwara et al. |
| 2004/0104197 A1* | 6/2004 | Shigemura ............ C23C 14/042 216/20 |

(Continued)

FOREIGN PATENT DOCUMENTS

| CN | 1510971 A | 7/2004 |
| CN | 103014618 A | 4/2013 |

(Continued)

OTHER PUBLICATIONS

PCT International Search Report for International Application No. PCT/CN2020/086112 dated Jul. 7, 2020.

(Continued)

*Primary Examiner* — Binu Thomas
(74) *Attorney, Agent, or Firm* — Rimon PC

(57) ABSTRACT

A mask includes an opening area and a shelter area adjacent to the opening area, the opening area includes an opening pattern, the shelter area includes a buffer pattern adapted to the opening pattern. This application achieves a purpose that a sudden change of stress at a boundary between the opening area and the shelter area is buffered, thereby ensuring that the pull of the mesh as it opens may be smoothly transmitted from the shelter area to the opening area. In addition, this application may also effectively improve meshing accuracy of the mask, thereby improving a yield of vapor deposition products.

14 Claims, 5 Drawing Sheets

(56) References Cited

U.S. PATENT DOCUMENTS

| | | | | |
|---|---|---|---|---|
| 2011/0229633 | A1* | 9/2011 | Hong | H10K 71/166 |
| | | | | 118/504 |
| 2014/0030894 | A1* | 1/2014 | Shin | H01L 21/0337 |
| | | | | 430/5 |
| 2014/0150721 | A1* | 6/2014 | Oh | C23C 14/042 |
| | | | | 118/504 |
| 2015/0007768 | A1* | 1/2015 | Lee | C23C 14/042 |
| | | | | 118/504 |
| 2015/0034005 | A1* | 2/2015 | Ko | C23C 14/042 |
| | | | | 118/504 |
| 2017/0179390 | A1* | 6/2017 | Baek | C23C 14/042 |
| 2017/0294317 | A1* | 10/2017 | Chou | H01L 21/0274 |
| 2018/0248155 | A1* | 8/2018 | Han | C23C 16/042 |
| 2019/0378984 | A1* | 12/2019 | Nakamura | C23C 14/042 |

FOREIGN PATENT DOCUMENTS

| | | |
|---|---|---|
| CN | 203021638 U | 6/2013 |
| CN | 103205693 A | 7/2013 |
| CN | 103938153 A | 7/2014 |
| CN | 104630705 A | 5/2015 |
| CN | 204434720 U | 7/2015 |
| CN | 105803389 A | 7/2016 |
| CN | 206477019 U | 9/2017 |
| CN | 107435131 A | 12/2017 |
| CN | 107460436 A | 12/2017 |
| CN | 107815641 A | 3/2018 |
| CN | 108796435 A | 11/2018 |
| CN | 109487206 A | 3/2019 |
| CN | 109554664 A | 4/2019 |
| CN | 109628879 A | 4/2019 |
| CN | 109722630 A | 5/2019 |
| CN | 110396660 A | 11/2019 |
| JP | 2013209697 A | 10/2013 |

OTHER PUBLICATIONS

PCT Written opinion for International Application No. PCT/CN2020/086112 dated Jul. 7, 2020.

Chinese First Office Action for CN Application No. 201910813249.7 dated Jan. 12, 2021.

Chinese Second Office Action for CN Application No. 201910813249.7 dated May 28, 2021.

\* cited by examiner

MASK

CROSS-REFERENCE TO RELATED APPLICATIONS

The present application is a continuation of International Application No. PCT/CN2020/086112, filed on Apr. 22, 2020, which claims priority to Chinese Patent Application No. 201910813249.7, filed on Aug. 30, 2019. All applications are incorporated herein by reference in their entireties.

TECHNICAL FIELD

The present application relates to the field of display technology, in particular to a mask.

BACKGROUND

Organic Light Emitting Diode (OLED) display devices occupy an important position in the field of display technology with many advantages such as light and thin, high brightness, low power consumption, high definition and so on. Many structures (such as a cathode layer) in the OLED display device may be prepared by evaporation with a mask. However, in the related art, poor meshing accuracy of the mask may result in a low product yield.

SUMMARY

In view of this, the present application provides a mask to solve a problem of poor meshing accuracy of the mask.

The present application provides a mask. The mask includes an opening area and a shelter area adjacent to the opening area, the opening area includes an opening pattern; the shelter area includes a buffer pattern adapted to the opening pattern.

For the mask according to the present application, by a mean of providing a buffer unit set in a shelter area, the buffer unit set is corresponding to an opening unit set of an opening area, which achieves a purpose that a sudden change of stress at a boundary between the opening area and the shelter area is buffered, thereby ensuring that the pull of the mesh as it opens may be smoothly transmitted from the shelter area to the opening area. In addition, in the present application, a quality of the mask may be reduced by the buffer unit set in the shelter area, thereby reducing a bad effect on the mask due to the gravity of the mask itself, thereby reducing a sagging amount of the mask. Therefore, the meshing accuracy of the mask may be effectively improved according to the present application, thereby a yield of vapor deposition products may be improved.

DETAILED DESCRIPTION OF THE EMBODIMENTS

Technical schemes in embodiments of the present application will be described clearly and completely below in combination with accompanying drawings in the embodiments of the present application. Obviously, the described embodiments are only a part of embodiments of the present application, rather than all embodiments. Based on the embodiments in the present application, all other embodiments obtained by those skilled in the art without creative efforts shall fall within the protection scope of the present application.

As is well known, a mask includes an opening area and a shelter area adjacent to the opening area. In an actual preparation process of the mask, it is usually necessary to weld a mesh of the mask to a frame of the mask according to a position of a preset welding line. When the welding is completed, a buffer area is cut off along an edge which is located in an outer area of the welding line and has a preset distance from the welding line.

In an actual use process of the mask, material to be evaporated is evaporated on a substrate to be evaporated (such as a glass substrate) through the mask. The material to be evaporated corresponding to the opening area of the mask is evaporated to a position to be evaporated through the opening area, and the material to be evaporated corresponding to the shelter area of the mask is blocked by the shelter area. From this, it can be seen that an accuracy of a vapor evaporation is directly affected by meshing accuracy of the mask. However, reasons that affect the meshing accuracy of the mask mainly include the following two points.

Firstly, an overall quality of the mask is relatively large, affected by the gravity, in a process of meshing and vapor deposition of the mask, the great gravity may cause a great sagging amount of the mask, thereby reducing the meshing accuracy of the mask. Secondly, even if the pull of the mesh as it opens is applied to minimize the sagging amount of the mask during the meshing process of the mask, however, the mask includes the shelter area and the opening area, and a structure of the shelter area is different from a structure of the opening area. Therefore, it is difficult to smoothly transmit the pull of the mesh as it opens from the shelter area to the opening area. In addition, wrinkles may be generated at a boundary between the shelter area and the opening area, and the wrinkles may even extend to the welding line between the opening area and the shelter area, which leads to a phenomenon of invalid welding, which further reduces the meshing accuracy of the mask.

Figure 1A:
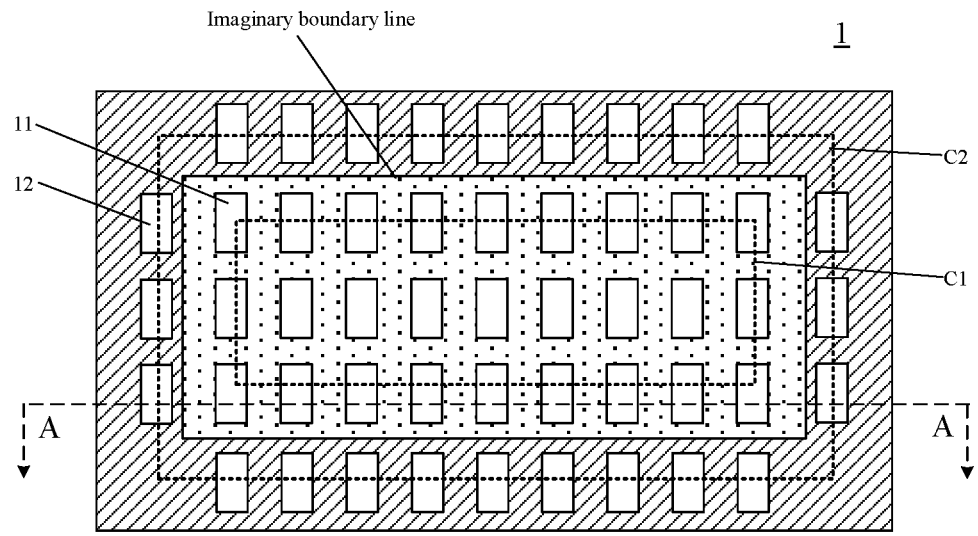
FIG. 1a is a structural diagram of a top view of a mask according to a first embodiment of the present application.
Figure 1B:
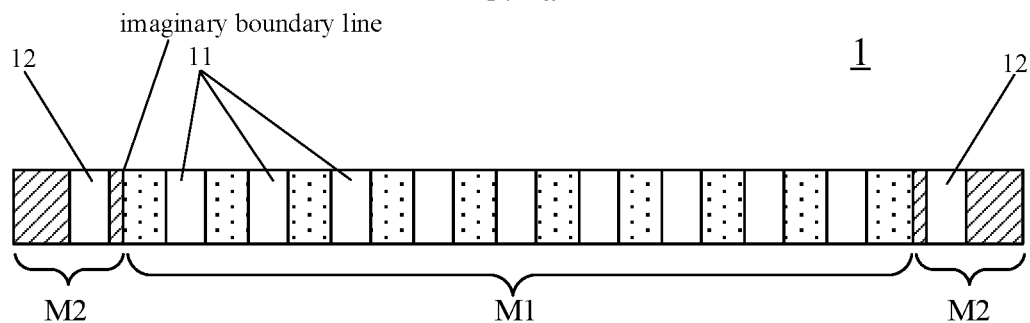
FIG. 1b is a sectional diagram of the mask according to the first embodiment of the present application.

FIG. 1a is a structural diagram of a top view of a mask according to a first embodiment of the present application. FIG. 1b is a sectional diagram of the mask according to the first embodiment of the present application. Specifically, FIG. 1b is a sectional diagram taken along a section line A-A shown in FIG. 1a.

As shown in FIG. 1a and FIG. 1b, a mask 1 according to the present application is a rectangular plate structure. The mask 1 includes a rectangular opening area M1 and a shelter area M2 circumferentially surrounding the opening area M1. The opening area M1 includes an opening pattern. Specifically, the opening pattern includes a plurality of opening units 11. Each of the opening units 11 is a rectangular through groove. The mask 1 is penetrated by the plurality of opening units 11 along a direction perpendicular to a plane where the mask 1 is located (a vertical direction of an orientation as shown in FIG. 1b). Shapes and sizes of the plurality of opening units 11 are the same. The shelter area M2 includes a buffer pattern. Specifically, the buffer pattern includes a plurality of buffer units 12. Each of the buffer units 12 is also a rectangular through groove. The mask 1 is penetrated by the plurality of buffer units 12 along the direction perpendicular to the plane where the mask 1 is located (the vertical direction of the orientation as shown in FIG. 1b). Moreover, not only shapes and sizes of the plurality of buffer units 12 are the same, but also the shapes and sizes of the plurality of buffer units 12 are the same as the shapes and sizes of the plurality of opening units 11 respectively.

Continuing to refer to FIG. 1a and FIG. 1b, the plurality of opening units 11 in the opening area M1 are arranged in an array including a plurality of parallel rows and a plurality of parallel columns. Among all the opening units 11 in the opening area M1, a plurality of opening units 11 adjacent to a boundary between the opening area M1 and the shelter area M2 form an opening unit set C1. A plurality of buffer units 12 in the shelter area M2 form a buffer unit set C2 having an adaptation with the opening unit set C1. In other words, the boundary between the opening area M1 and the shelter area M2 is taken as a boundary, and a plurality of buffer units 12 are respectively arranged in a one-to-one correspondence with the opening units 11 in the opening unit set C1, the buffer unit set C2 is formed by the plurality of the buffer units 12.

For example, the adaptation between the opening unit set C1 and the buffer unit set C2 refers to that each of the plurality of opening units 11 in the opening unit set C1 is corresponding to at least one of the plurality of buffer unit 12 in the buffer unit set C2 in a row direction of the array and/or a column direction of the array.

During the actual meshing process of the mask, the plurality of buffer units 12 in the buffer unit set C2 may buffer a sudden change of stress at the boundary between the opening area M1 and the shelter area M2, thereby reducing or even avoiding the wrinkles at the boundary.

For the mask according to the present application, by a mean of providing the buffer unit set C2 which is corresponding to the opening unit set C1 of the opening area M1, the buffer unit set C2 is provided in the shelter area M2, the sudden change of stress at the boundary between the opening area M1 and the shelter area M2 may be buffered, thereby the pull of the mesh as it opens may be smoothly transmitted from the shelter area M2 to the opening area M1. In addition, in the present application, a quality of the mask 1 may be reduced by a mean of providing the buffer unit set C2 in the shelter area M2, thereby a bad effect of the gravity of the mask 1 which effects on itself may be reduced, and the sagging amount of the mask may be reduced. Therefore, compared with the mask in the related art, the meshing accuracy of the mask 1 may effectively improved according to the present application, thereby a yield of vapor deposition products may be improved.

If shapes and sizes of the plurality of opening units 11 in the opening unit set C1 are similar to shapes and sizes of the corresponding buffer units 12 in the buffer unit set C2, the sudden change of stress at the boundary between the opening area M1 and the shelter area M2 may also be buffered, thereby the pull of the mesh as it opens may be smoothly transmitted from the shelter area M2 to the opening area M1.

Figure 2:
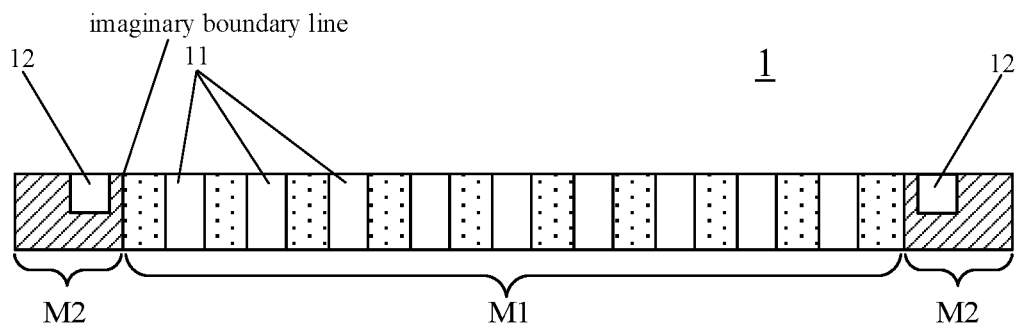
FIG. 2 is a sectional diagram of a mask according to a second embodiment of the present application.

FIG. 2 is a sectional diagram of a mask according to a second embodiment of the present application. The embodiment shown in FIG. 2 according to the present application is extended from the basis of the embodiment shown in FIG. 1a and FIG. 1b according to the present application. The following highlights the differences between the embodiment shown in FIG. 2 and the embodiment shown in FIG. 1a and FIG. 1b, and similarities will not be repeated. Specifically, FIG. 2 is a sectional diagram of the mask of the second embodiment taken along a section line A-A shown in FIG. 1a.

As shown in FIG. 2, for a mask 1 according to the present embodiment, a plurality of buffer units 12 are rectangular grooves that do not penetrate the mask 1. Specifically, the plurality of buffer units 12 penetrate an upper surface of the mask 1 (an upper surface in an orientation shown in FIG. 2), but do not penetrate a lower surface of the mask 1 (a lower surface in the orientation shown in FIG. 2).

For the mask according to the present embodiment, by a mean of providing the plurality of buffer units 12 that do not penetrate through the mask 1, a situation that material to be evaporated is evaporated to a substrate to be evaporated through the plurality of buffer units 12 is effectively avoided, thereby an bad effect of the plurality of buffer units 12 on a vapor deposition is effectively avoided.

Figure 3:
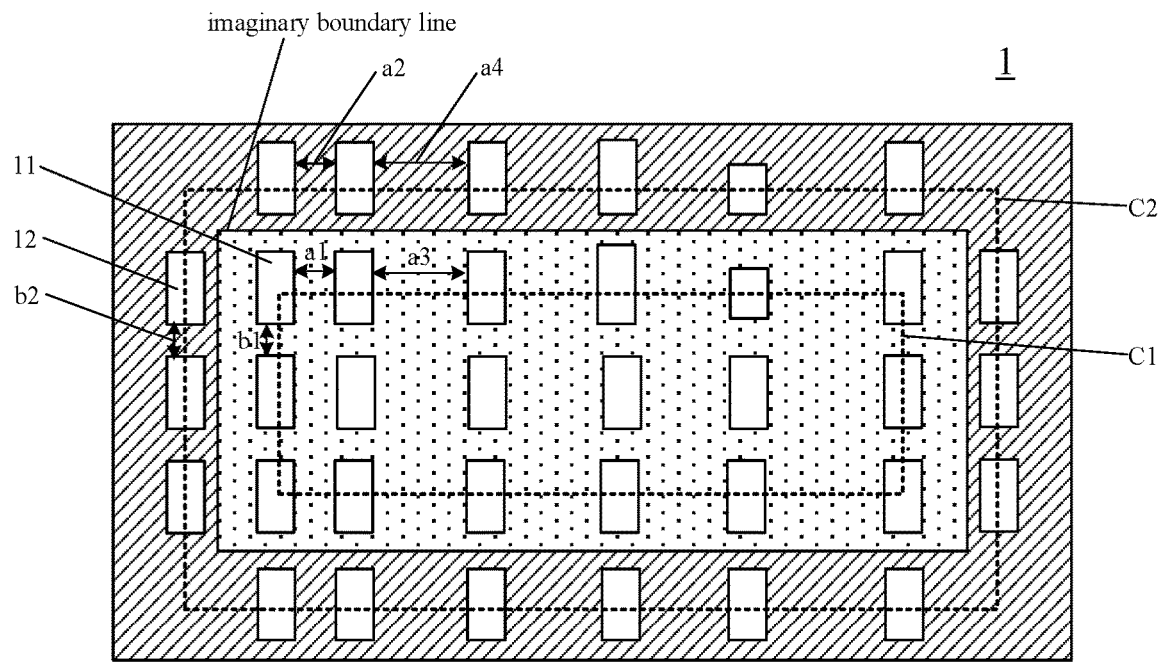
FIG. 3 is a structural diagram of a top view of a mask according to a third embodiment of the present application.

FIG. 3 is a structural diagram of a top view of a mask according to a third embodiment of the present application. The embodiment shown in FIG. 3 according to the present application is extended from the basis of the embodiment shown in FIG. 1a and FIG. 1b according to the present application. The following highlights differences between the embodiment shown in FIG. 3 and the embodiment shown in FIG. 1a and FIG. 1b, and similarities will not be repeated.

As shown in FIG. 3, for a mask 1 according to the present embodiment, shapes and sizes of a plurality of opening units 11 in an opening area M1 are not completely the same. However, the shape and size of each opening unit 11 in an opening unit set C1 are exactly the same as the shape and size of a corresponding buffer unit 12 in a buffer unit set C2. Moreover, an absolute value of a difference between a distance between two adjacent opening units 11 and a corresponding distance between two adjacent buffer units 12, falls into a preset range of the difference.

Optionally, in the opening unit set C1 and the buffer unit set C2, an absolute value of a difference between a distance $a1$ between two adjacent opening units 11 along a row direction and a corresponding distance $a2$ between two adjacent buffer units 12 along a row direction falls into the preset range of the difference. Optionally, in the opening unit set C1 and the buffer unit set C2, an absolute value of a difference between a distance $a3$ between two adjacent opening units 11 along a row direction and a corresponding distance $a4$ between two adjacent buffer units 12 along a row direction falls into the preset range of the difference. Optionally, in the opening unit set C1 of the mask 1 according to the present application, not all the distances between two adjacent opening units 11 along a row direction are equal, for example, the distance a1 between two adjacent opening units 11 along a row direction is not equal to the distance a3 between two adjacent opening units 11 along a row direction. As long as the absolute value of the difference between the distance between two adjacent opening units 11 along a row direction and the corresponding distance between two adjacent buffer units 12 along a row direction falls into the preset range of the difference.

Optionally, in the opening unit set C1 and the buffer unit set C2, an absolute value of a difference between a distance b1 between two adjacent opening units 11 along a column direction and a corresponding distance b2 between two adjacent buffer units 12 along a column direction falls into the preset range of the difference. Optionally, in the opening unit set C1 of the mask 1 according to the present application, not all the distances between two adjacent opening units 11 along a column direction are equal, as long as the absolute value of the difference between the distance between two adjacent opening units 11 along a column direction and the corresponding distance between two adjacent buffer units 12 along a column direction falls into the preset range of the difference.

Optionally, a specific value of the preset range of the difference may be determined according to actual conditions. For example, the preset range of the difference refers to a closed range of 0 mm to 10 mm. After many experiments, the inventor found that setting the preset range of the difference to the closed range of 0 mm to 10 mm can not only ensure a buffering effect of the buffer unit set C2, but also improve the setting flexibility of the buffer unit set C2.

For the mask 1 according to the present embodiment, by a mean of defining that the shape and size of each opening unit 11 in the opening unit set C1 are exactly the same as the shape and size of the corresponding buffer unit 12 in the buffer unit set C2, consistency of transmission of the pull of the mesh as it opens at a boundary between the opening area M1 and the shelter area M2 may be effectively ensured, that is, smoothness of the transmission of the pull of the mesh as it opens is guaranteed. In addition, in the present application, by limiting the absolute value of the difference between the distance between two adjacent opening units 11 in the opening unit set C1 and the corresponding distance between two adjacent buffer units 12 in the buffer unit set C2 falls into the preset range of the difference, the transmitting smoothness of the pull of the mesh as it opens may be further enhanced. Furthermore, for the buffer unit set C2, an ability of buffering a sudden change of stress is further improved. The meshing accuracy of the mask 1 is further improved.

Optionally, in the opening unit set C1 and the buffer unit set C2, the distance between two adjacent opening units 11 along a row direction is equal to the corresponding distance between two adjacent buffer units 12 along a row direction, and the distance between two adjacent opening units 11 along a column direction is equal to the corresponding distance between two adjacent buffer units 12 along a column direction. That is, the distance between two adjacent opening units 11 is equal to the corresponding distance between two adjacent buffer units 12, and the opening units 11 in the opening unit set C1 and the buffer units 12 in the buffer unit set C2 are arranged symmetrically in a mirror image with respect to an imaginary boundary line between the opening area M1 and the shelter area M2. In the present application, the transmitting smoothness of the pull of the mesh as it opens may be greatly improved; for the buffer unit set C2, the ability of buffering the stress may be greatly improved; thereby the meshing accuracy of the mask 1 may be greatly improved.

Figure 4A:
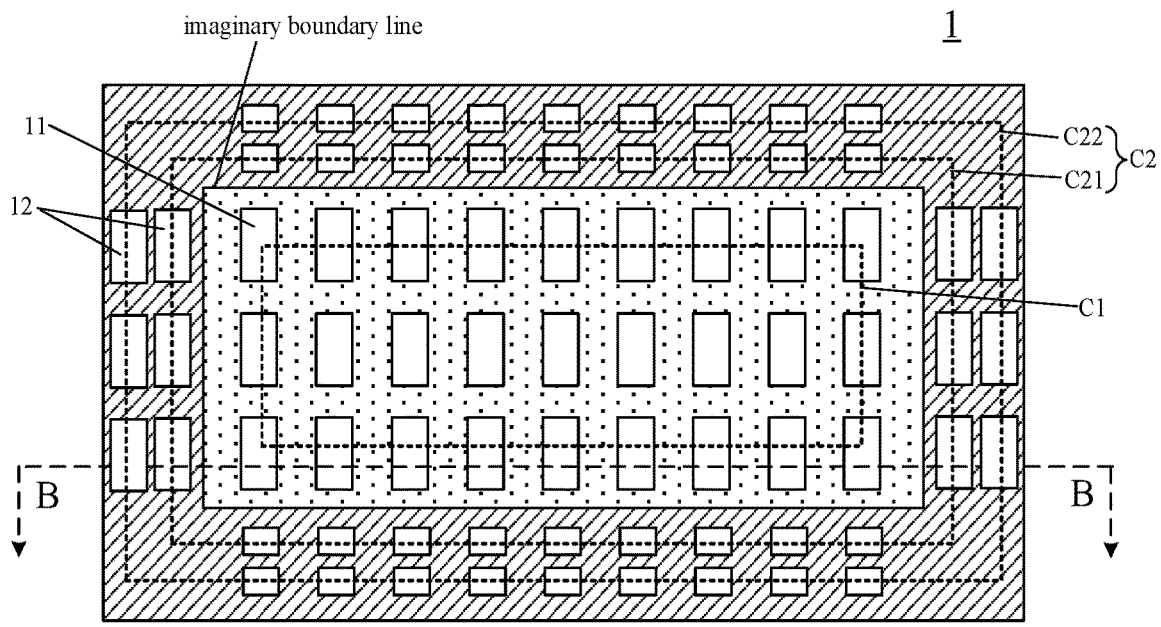
FIG. 4a is a structural diagram of a top view of a mask according to a fourth embodiment of the present application.
Figure 4B:
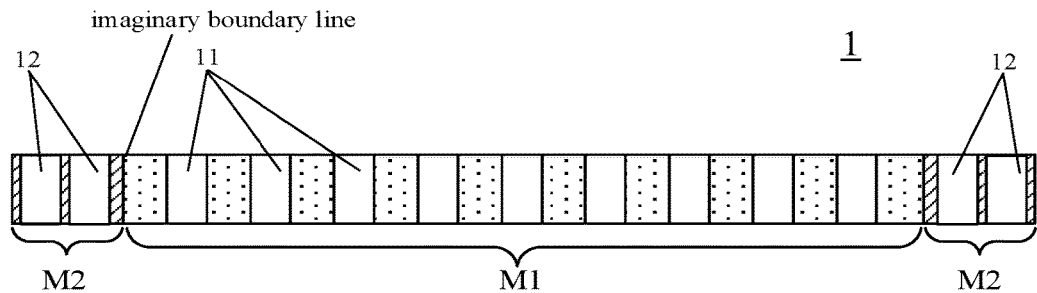
FIG. 4b is a sectional diagram of the mask according to the fourth embodiment of the present application.

FIG. 4a is a structural diagram of a top view of a mask according to a fourth embodiment of the present application. FIG. 4b is a sectional diagram of the mask according to the fourth embodiment of the present application. Specifically, FIG. 4b is a sectional diagram by taken along a section line B-B shown in FIG. 4a. The embodiment shown in FIG. 4a and FIG. 4b according to the present application is extended from the basis of the embodiment shown in FIG. 1a and FIG. 1b according to the present application. The following highlights differences between the embodiment shown in FIG. 4a and FIG. 4b and the embodiment shown in FIG. 1a and FIG. 1b, and similarities will not be repeated.

As shown in FIG. 4a and FIG. 4b, a buffer unit set C2 of a mask 1 according to the present embodiment includes a first buffer strip C21 and a second buffer strip C22 circumferentially surrounding the first buffer strip C21. Both the first buffer strip C21 and the second buffer strip C22 include a plurality of buffer units 12 respectively. The plurality of buffer units 12 in the first buffer strip C21 have a one-to-one correspondence with a plurality of opening units 11 in an opening unit set C1. A distance between two adjacent buffer units 12 along a row direction in the first buffer strip C21 is equal to a corresponding distance between two adjacent opening units 11 along a row direction in the opening unit set C1. A distance between two adjacent buffer units 12 along a column direction in the first buffer strip C21 is equal to a corresponding distance between two adjacent opening units 11 along a column direction in the opening unit set C1. In addition, the plurality of buffer units 12 in the second buffer strip C22 also have the one-to-one correspondence with the plurality of opening units 11 in the opening unit set C1. A distance between two adjacent buffer units 12 along a row direction in the second buffer strip C22 is equal to a corresponding distance between two adjacent opening units 11 along a row direction in the opening unit set C1. A distance between two adjacent buffer units 12 along a column direction in the second buffer strip C22 is equal to a corresponding distance between two adjacent opening units 11 along a column direction in the opening unit set C1.

The number of the buffer strips included in the buffer unit set C2 is not limited to two according to the present application, and may also be three or more.

For the mask according to the present embodiment, by a mean of limiting the buffer unit set C2 to include a plurality of buffer strips, a sudden change of stress between an opening area M1 and a shelter area M2 is better buffered. Compared with the embodiment shown in FIG. 1a and FIG. 1b, transmitting smoothness of the pull of the mesh as it opens is further improved according to this embodiment of the present application, thereby the meshing accuracy of the mask 1 is further improved.

Figure 5A:
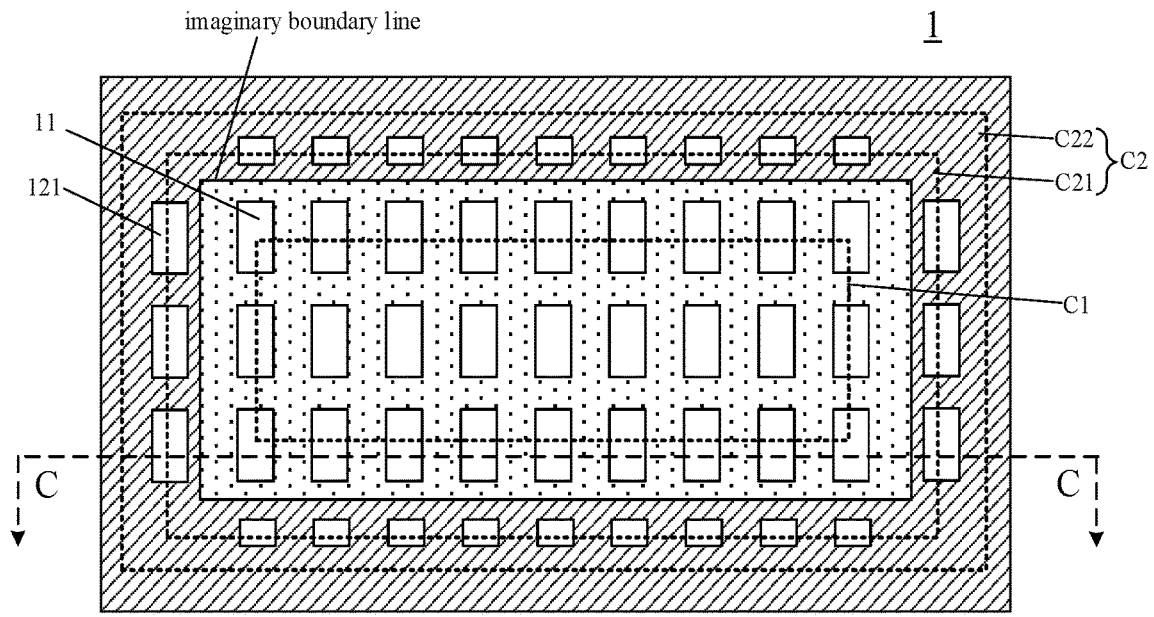
FIG. 5a is a structural diagram of a top view of a mask according to a fifth embodiment of the present application.
Figure 5B:
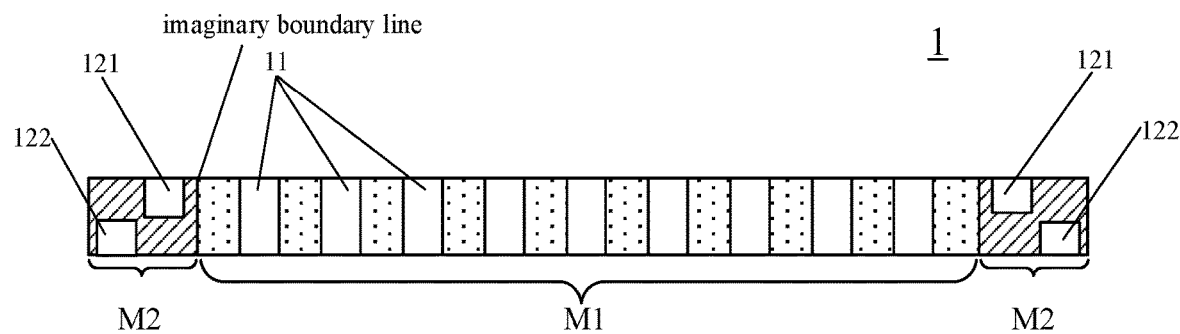
FIG. 5b is a sectional diagram of the mask according to the fifth embodiment of the present application.

FIG. 5a is a structural diagram of a top view of a mask according to a fifth embodiment of the present application. FIG. 5b is a sectional diagram of the mask according to the fifth embodiment of the present application. Specifically, FIG. 5b is a sectional diagram by taken along a section line C-C shown in FIG. 5a. The embodiment shown in FIG. 5a and FIG. 5b according to the present application is extended from the basis of the embodiment shown in FIG. 4a and FIG. 4b according to the present application. The following highlights differences between the embodiment shown in FIG. 5a and FIG. 5b and the embodiment shown in FIG. 4a and FIG. 4b, and similarities will not be repeated.

As shown in FIG. 5a and FIG. 5b, for a mask 1 according to the present embodiment, a first buffer strip C21 includes a plurality of first buffer grooves 121. The first buffer grooves 121 penetrate an upper surface of the mask 1 but do not penetrate a lower surface of the mask 1 (that is, the first buffer grooves 121 are formed on the upper surface of the mask 1). A second buffer strip C22 includes a plurality of second buffer grooves 122. The second buffer grooves 122 penetrate the lower surface of the mask 1 but do not penetrate the upper surface of the mask 1 (that is, the second buffer grooves 122 are formed on the lower surface of the mask 1). The first buffer grooves 121 have a one-to-one correspondence with the second buffer grooves 122.

The mask 1 according to the present embodiment may not only effectively avoid an bad effect of the through grooves defined in a shelter area M2 on an vapor deposition, but also, compared with the embodiment shown in FIG. 2, the present application may further enhance transmitting smoothness of the pull of the mesh as it opens. Furthermore, for the buffer unit set C2, an ability of buffering the stress is further improved, and the meshing accuracy of the mask 1 is further improved.

Figure 6:
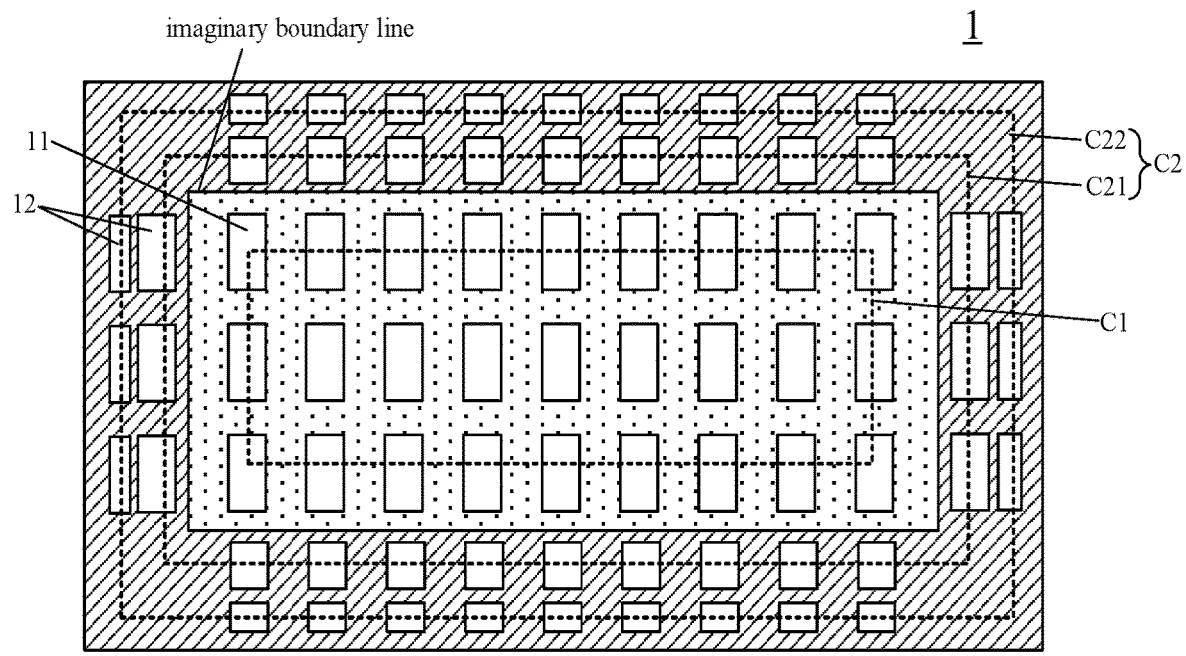
FIG. 6 is a structural diagram of a top view of a mask according to a sixth embodiment of the present application.

FIG. 6 is a structural diagram of a top view of a mask according to a sixth embodiment of the present application. The embodiment shown in FIG. 6 according to the present application is extended from the basis of the embodiment shown in FIG. 4a and FIG. 4b according to the present application. The following highlights differences between the embodiment shown in FIG. 6 and the embodiment shown in FIG. 4a and FIG. 4b, and similarities will not be repeated.

As shown in FIG. 6, in a mask 1 according to the present embodiment, respective widths of a plurality of buffer units respectively corresponding to a first buffer strip C21 and a second buffer strip C22 decrease along an extending direction from an opening area M1 to a shelter area M2. That is, along the extending direction from the opening area M1 to the shelter area M2, a width of each buffer unit in the first buffer strip C21 is larger than a width of each buffer unit in the second buffer strip C22.

For the mask 1 according to the present embodiment, by a mean of limiting the respective widths of the plurality of buffer units corresponding to the first buffer strip C21 and the second buffer strip C22 to decrease along the extending direction from the opening area M1 to the shelter area M2, the steppability of stress buffering between the opening area M1 and the shelter area M2 is ensured, and a space occupied by the buffer unit set C2 in the shelter area M2 is saved.

Figure 7:
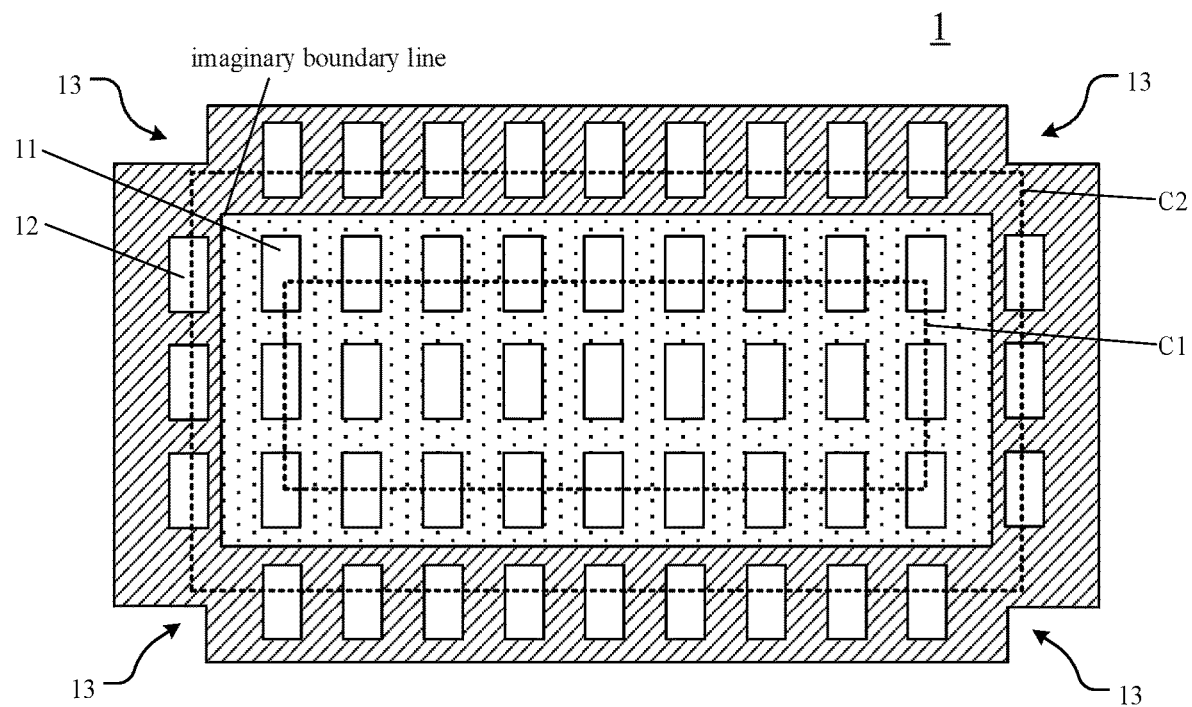
FIG. 7 is a structural diagram of a top view of a mask according to a seventh embodiment of the present application.

FIG. 7 is a structural diagram of a top view of a mask according to a seventh embodiment of the present application. The embodiment shown in FIG. 7 according to the present application is extended from the basis of the embodiment shown in FIG. 1a and FIG. 1b according to the present application. The following highlights differences between the embodiment shown in FIG. 7 and the embodiment shown in FIG. 1a and FIG. 1b, and similarities will not be repeated.

As shown in FIG. 7, for a mask 1 according to the present embodiment, a buffer slot 13 is provided in a corner of the mask 1. Specifically, the buffer slot 13 is a rectangular through groove penetrating the mask 1, and four buffer slots 13 are respectively disposed in four corners of the rectangular plate-shaped mask 1.

For the mask 1 according to the present embodiment, by a mean of setting the buffer slot 13 in the corner, the pull of the mesh as it opens applied to a shelter area M2 of the mask 1 may be well transmitted to an opening area M1, and wrinkles generated at the corners may be alleviated or even avoided, thereby a phenomenon of invalid welding of mesh surface of the mask during the meshing process may be avoided.

Figure 8:
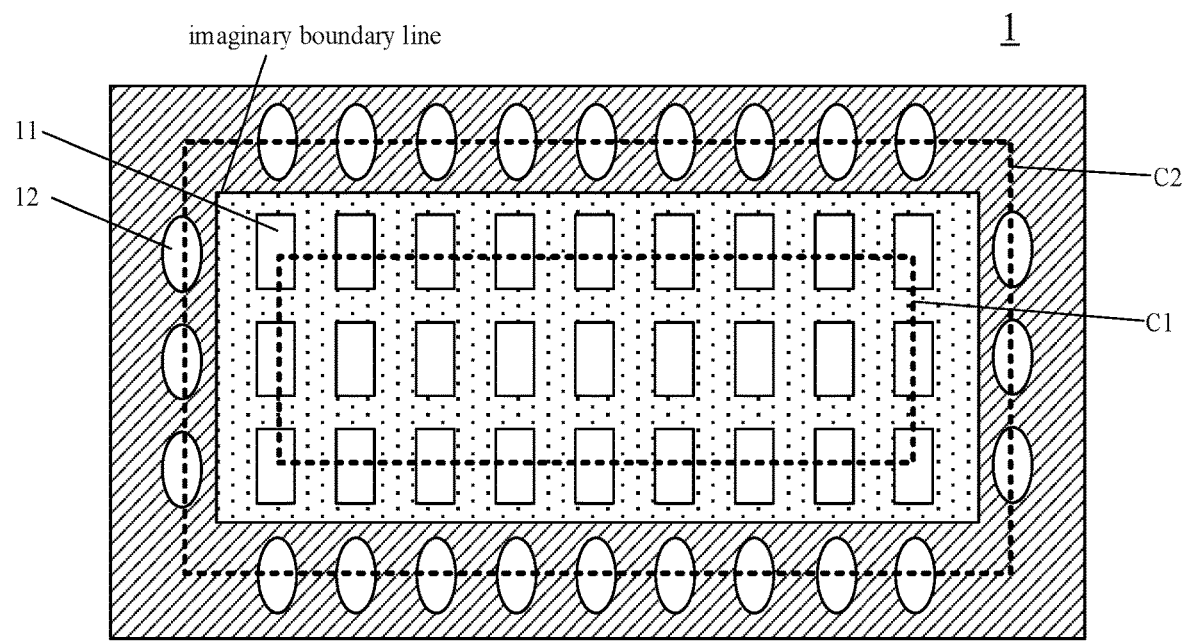
FIG. 8 is a structural diagram of a top view of a mask according to an eighth embodiment of the present application.

FIG. 8 is a structural diagram of a top view of a mask according to an eighth embodiment of the present application. The embodiment shown in FIG. 8 according to the present application is extended from the basis of the embodiment shown in FIG. 1a and FIG. 1b according to the present application. The following highlights differences between the embodiment shown in FIG. 8 and the embodiment shown in FIG. 1a and FIG. 1b, and similarities will not be repeated.

As shown in FIG. 8, for a mask 1 according to the present application, a plurality of buffer units 12 included in a buffer unit set C2 are elliptical through grooves. That is, shapes of the plurality of buffer units 12 in the buffer unit set C2 are different from shapes of a plurality of opening units 11 in an opening unit set C1.

For the mask 1 according to the present embodiment, by a mean of limiting that the shapes of the plurality of buffer units 12 in the buffer unit set C2 are different from the shapes of the plurality of opening units 11 in the opening unit set C1, the setting flexibility of the buffer unit set C2 is further improved, and the adaptability and universality of application of the mask 1 are further improved.

Figure 9:
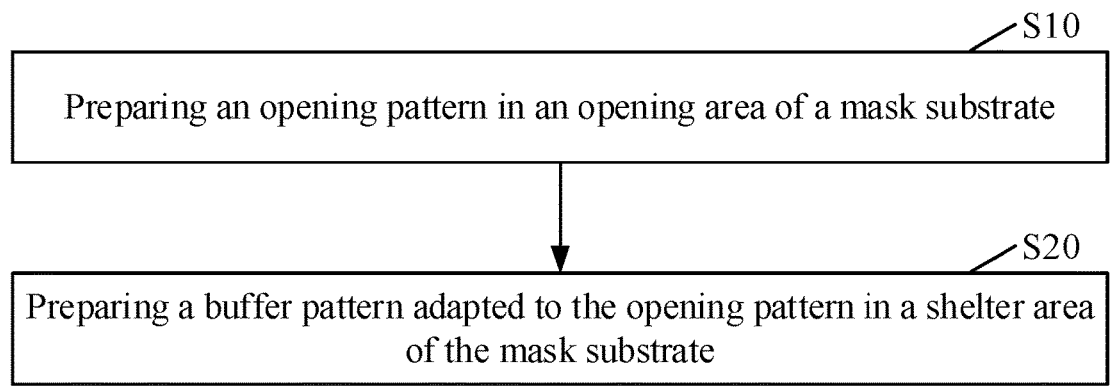
FIG. 9 is a flowchart of a method for preparing a mask according to a ninth embodiment of the present application.

FIG. 9 is a flowchart of a method for preparing a mask according to a ninth embodiment of the present application. As shown in FIG. 9, the method for preparing the mask according to the present application includes the following steps.

Step S10: preparing an opening pattern in an opening area of a mask substrate.

Step S20: preparing a buffer pattern adapted to the opening pattern in a shelter area of the mask substrate.

Optionally, the opening pattern and the buffer pattern may be prepared by etching.

In an actual application process, firstly, the opening pattern in the opening area of the mask substrate is prepared firstly, and then the buffer pattern adapted to the opening pattern is prepared in the shelter area of the mask substrate.

For the method for preparing the mask according to the present application, by a mean of preparing the buffer pattern adapted to the opening pattern in the shelter area of the mask substrate, a sudden change of stress at a boundary between the opening area and the shelter area is buffered, thereby the pull of the mesh as it opens may be smoothly transmitted from the shelter area to the opening area. Therefore, compared with a method for preparing a mask in related art, the method for preparing the mask according to the present application may effectively improve meshing accuracy of the mask, thereby improving a yield of vapor deposition products.

The above embodiments only the preferred embodiments of the present application, and are not intended to limit the present application. Any modification, equivalent replacement, etc. made within the spirit and principles of the present application may be included in the scope of protection of the present application.

What is claimed is:

1. A mask, comprising:
   an opening area comprising an opening pattern; and
   a shelter area adjacent to the opening area, the shelter area comprising a buffer pattern adapted to the opening pattern; wherein the opening pattern comprises a plurality of opening units, the buffer pattern comprises a plurality of buffer units, and an opening unit set is formed by the plurality of opening units adjacent to the shelter area, a buffer unit set is formed by the plurality of buffer units and has an adaptation with the opening unit set; an adaptation relationship between the buffer unit set and the opening unit set is that adjacent opening unit and buffer unit in the same column have the same length in a row direction, and adjacent opening unit and buffer unit in the same row have the same length in a column direction; and thicknesses of the opening area and the shelter area are the same, the buffer unit set comprises a plurality of buffer strips surrounding the opening unit set, and each of the buffer strips is formed by the plurality of buffer units corresponding to the opening units in the opening unit set, the plurality of buffer strips comprise a first buffer strip and a second buffer strip circumferentially surrounding the first buffer strip, the second buffer strip comprises a plurality of second buffer grooves formed on a lower surface of the mask, and the plurality of second buffer grooves penetrate the lower surface of the mask but do not penetrate an upper surface of the mask.

2. The mask according to claim 1, wherein the plurality of opening units in the opening pattern are arranged in an array comprising a plurality of parallel rows and a plurality of parallel columns, and each of the plurality of opening units in the opening unit set is corresponding to at least one of the plurality of buffer units in the buffer unit set in a row direction of the array and/or a column direction of the array.

3. The mask according to claim 1, wherein the plurality of opening units in the opening unit set and the plurality of buffer units in the first buffer strip are arranged symmetrically in a mirror image with respect to an imaginary boundary line between the opening area and the shelter area.

4. The mask according to claim 1, wherein an absolute value of a difference between a distance between two adjacent opening units in the opening unit set and a corresponding distance between two adjacent buffer units in the first buffer strip falls into a preset range of the difference, and an absolute value of a difference between the distance between two adjacent opening units in the opening unit set and a corresponding distance between two adjacent buffer units in the second buffer strip falls into the preset range of the difference.

5. The mask according to claim 4, wherein the distance is a distance between two adjacent opening/buffer units in a row direction or in a column direction.

6. The mask according to claim 4, wherein the preset range of the difference refers to a closed range of 0 mm to 10 mm.

7. The mask according to claim 4, wherein the distance between two adjacent opening units in the opening unit set is equal to the corresponding distance between two adjacent buffer units in the first buffer strip and the corresponding distance between two adjacent buffer units in the second buffer strip.

8. The mask according to claim 1, wherein a shape of each of the opening units in the opening unit set is the same as a shape of a corresponding buffer unit in the first buffer strip and a shape of a corresponding buffer unit in the second buffer strip.

9. The mask according to claim 8, wherein a size of each of the opening units in the opening unit set is the same as a size of the corresponding buffer unit in the first buffer strip and the corresponding buffer unit in the second buffer strip.

10. The mask according to claim 1, wherein respective widths of the plurality of buffer units corresponding to the plurality of the buffer strips decrease along an extending direction of the opening area to the shelter area.

11. The mask according to claim 1, wherein the first buffer strip comprises a plurality of first buffer grooves formed on the upper of the mask.

12. The mask according to claim 1, wherein the mask comprises at least one buffer slot in at least one corner of the mask.

13. The mask according to claim 11, the plurality of first buffer grooves penetrate the upper surface of the mask but do not penetrate the lower surface of the mask.

14. The mask according to claim 13, wherein the sum of the thickness of one of the first buffer grooves and one of the second buffer grooves is less than the thickness of the shelter area.

* * * * *